(12) United States Patent
Balana Avila et al.

(10) Patent No.: US 11,374,366 B2
(45) Date of Patent: Jun. 28, 2022

(54) SYSTEM AND METHOD FOR PROVIDING AN ELECTRICAL GROUND CONNECTION FOR A CIRCUIT ASSEMBLY

(71) Applicant: Lear Corporation, Southfield, MI (US)

(72) Inventors: Joan Balana Avila, Valls (ES); Alberto Aragones Carrete, Valls (ES); Joan Ignasi Ferran Palau, Valls (ES); Xavier Blas Morales, Valls (ES); Oscar Cano Salomo, Valls (ES)

(73) Assignee: LEAR CORPORATION, Southfield, MI (US)

( * ) Notice: Subject to any disclaimer, the term of this patent is extended or adjusted under 35 U.S.C. 154(b) by 70 days.

(21) Appl. No.: 16/906,692

(22) Filed: Jun. 19, 2020

(65) Prior Publication Data

US 2021/0399501 A1    Dec. 23, 2021

(51) Int. Cl.
*H01R 13/6594* (2011.01)
*H01R 43/20* (2006.01)

(52) U.S. Cl.
CPC ......... *H01R 13/6594* (2013.01); *H01R 43/20* (2013.01); *H01R 2201/26* (2013.01)

(58) Field of Classification Search
CPC . H01R 13/6594; H01R 43/20; H01R 2201/26
See application file for complete search history.

(56) References Cited

U.S. PATENT DOCUMENTS 3,097,032 A    7/1963 Hochheiser
3,218,606 A    11/1965 Schultz
3,270,251 A    8/1966 Evans
3,836,935 A    9/1974 Johnson
3,932,934 A    1/1976 Lynch et al.
4,050,621 A    9/1977 Bouley
4,662,691 A    5/1987 Derdzinski
4,663,815 A    5/1987 Hartman et al.
(Continued)

FOREIGN PATENT DOCUMENTS

CN    1538559 A    10/2004
CN    104218419 A    12/2014
(Continued)

OTHER PUBLICATIONS

U.S. Appl. No. 17/248,494, filed Jan. 27, 2021 (19 Pages).

*Primary Examiner* — Abdullah A Riyami
*Assistant Examiner* — Nader J Alhawamdeh
(74) *Attorney, Agent, or Firm* — Brooks Kushman P.C.

(57) ABSTRACT

A system is described for providing an electrical ground connection for a circuit assembly. The system may include a housing for the circuit assembly, the housing having an electrically conductive fixation member configured for attachment to an electrically conductive element outside the housing. The system may also include an electrically conductive feature configured for attachment to the circuit assembly, the electrically conductive feature comprising a flexible contact terminal configured to contact the electrically conductive fixation member inside the housing. Attachment of the electrically conductive fixation member to the electrically conductive element outside the housing enables an electrical ground connection for the circuit assembly via the electrically conductive feature comprising the flexible contact terminal.

21 Claims, 4 Drawing Sheets

(56) References Cited

U.S. PATENT DOCUMENTS

| | | | |
|---|---|---|---|
| 4,884,335 A | 12/1989 | McCoy et al. | |
| 4,890,199 A | 12/1989 | Beutler | |
| 5,131,853 A | 7/1992 | Meyer | |
| 5,199,887 A | 4/1993 | Iacono | |
| 5,218,760 A | 6/1993 | Colton et al. | |
| 5,599,208 A | 2/1997 | Ward | |
| 5,688,130 A | 11/1997 | Huang | |
| 5,704,752 A | 1/1998 | Logerot | |
| 5,802,699 A | 9/1998 | Fjelstad et al. | |
| 5,816,835 A | 10/1998 | Meszaros | |
| 5,997,367 A | 12/1999 | Nowak et al. | |
| 6,062,919 A | 5/2000 | Trafton | |
| 6,206,728 B1 * | 3/2001 | Krehbiel | H05K 9/0018 439/607.28 |
| 6,413,119 B1 * | 7/2002 | Gabrisko, Jr. | H01R 13/719 439/620.05 |
| 6,493,233 B1 | 12/2002 | De Lorenzo et al. | |
| 6,783,376 B2 | 8/2004 | Will et al. | |
| 6,790,051 B1 | 9/2004 | Secall et al. | |
| 6,799,980 B2 | 10/2004 | Bloomfield et al. | |
| 6,824,403 B2 | 11/2004 | Hall et al. | |
| 6,837,730 B2 | 1/2005 | Poh et al. | |
| 6,980,017 B1 | 12/2005 | Farnworth et al. | |
| 7,044,755 B2 | 5/2006 | Hatakeyama | |
| 7,149,089 B2 * | 12/2006 | Blasko | H01R 13/521 361/752 |
| 7,297,026 B2 * | 11/2007 | Toda | H01R 12/777 439/607.04 |
| 7,347,698 B2 | 3/2008 | Dittmann | |
| 7,351,091 B1 | 4/2008 | Zhang | |
| 7,354,276 B2 | 4/2008 | Dittman | |
| 7,361,055 B2 * | 4/2008 | Fuerst | H01R 13/514 439/620.09 |
| 7,364,442 B2 * | 4/2008 | Bang | H05K 1/119 439/92 |
| 7,396,254 B2 * | 7/2008 | Harmelink | H01R 13/518 439/540.1 |
| 7,510,407 B1 * | 3/2009 | Blasko | H01R 13/7195 439/620.1 |
| 7,581,965 B1 | 9/2009 | Upasani et al. | |
| 7,943,859 B2 | 5/2011 | Ambo et al. | |
| 7,976,319 B2 | 7/2011 | Nguyen et al. | |
| 8,038,465 B2 | 10/2011 | Pavlovic | |
| 8,294,043 B2 | 10/2012 | Munoz et al. | |
| 8,696,367 B2 | 4/2014 | Daughtry, Jr. et al. | |
| 8,790,122 B2 | 7/2014 | Malehorn, II et al. | |
| 8,854,835 B2 * | 10/2014 | Feldstein | H01R 12/724 361/818 |
| 8,979,452 B2 | 3/2015 | Ikuno | |
| 9,167,698 B2 | 10/2015 | Konda et al. | |
| 9,257,778 B2 | 2/2016 | Buck et al. | |
| 9,320,165 B2 * | 4/2016 | Gruber | H05K 5/0069 |
| 9,437,974 B2 | 9/2016 | Glick et al. | |
| 9,496,632 B2 | 11/2016 | Schmalbuch et al. | |
| 9,543,703 B2 | 1/2017 | Horchler et al. | |
| 9,680,247 B1 | 6/2017 | Glick et al. | |
| 9,705,214 B2 | 7/2017 | Tramet et al. | |
| 9,705,259 B2 | 7/2017 | Feldner | |
| 9,711,876 B2 | 7/2017 | Feye-Hohmann | |
| 9,711,926 B2 | 7/2017 | Belanger, Jr. | |
| 9,774,117 B1 | 9/2017 | Jackson et al. | |
| 9,873,392 B2 * | 1/2018 | Matsumura | B60R 16/0238 |
| 10,050,358 B2 | 8/2018 | Muller et al. | |
| 10,122,044 B2 | 11/2018 | De Souza et al. | |
| 10,348,029 B2 | 7/2019 | Flender et al. | |
| 10,418,728 B2 | 9/2019 | Fu et al. | |
| 10,573,983 B2 | 2/2020 | Webber et al. | |
| 10,673,160 B2 | 6/2020 | Baier et al. | |
| 10,707,598 B2 | 7/2020 | Fu et al. | |
| 2003/0024734 A1 | 2/2003 | Ineson et al. | |
| 2004/0209498 A1 | 10/2004 | Hatakeyama | |
| 2010/0040431 A1 | 2/2010 | Suzuki | |
| 2010/0112859 A1 | 5/2010 | Olawsky et al. | |
| 2010/0311255 A1 | 12/2010 | Reisinger et al. | |
| 2011/0059633 A1 | 3/2011 | Chen et al. | |
| 2020/0176902 A1 | 6/2020 | Fu et al. | |
| 2020/0370733 A1 | 11/2020 | Hatano | |

FOREIGN PATENT DOCUMENTS

| | | |
|---|---|---|
| CN | 105514626 A | 4/2016 |
| CN | 107069340 A | 8/2017 |
| EP | 1983811 A2 | 10/2008 |
| EP | 3001508 A1 | 3/2016 |
| FR | 3039329 A1 | 1/2017 |
| JP | H10189316 A | 7/1998 |

* cited by examiner

SYSTEM AND METHOD FOR PROVIDING AN ELECTRICAL GROUND CONNECTION FOR A CIRCUIT ASSEMBLY

TECHNICAL FIELD

The following relates to a system and method for providing an electrical ground connection for a circuit assembly.

BACKGROUND

Automotive vehicles having high voltage (HV) batteries, such as electric vehicles (EV) and hybrid electric vehicles (HEV), may include battery monitoring systems (BMS) to monitor and/or improve performance the HV batteries. In that regard, a BMS is an electronic unit that is inserted by the automotive original equipment manufacturer (OEM) inside a housing for an EV or HEV HV battery as part of a vehicle HV battery system, which may include battery cells, a cooling system, and battery cell monitoring electronics.

The BMS of a HV battery system requires a good connection to the vehicle ground (GIN), such as the chassis of the vehicle. Indeed, such a ground connection may be required by various electronic assemblies or electronic arrangements that may be used throughout any type of vehicle, which electronic assemblies or electronic arrangements may include and/or comprise circuit assemblies, printed circuit boards (PCB), fuse boxes, controllers, modules, units, systems, or any other type of electronic assembly or electronic arrangement.

In that regard, compact and/or restrictive requirements may govern the placement of a HV battery system in an EV or HEV. Such compact and/or restrictive placement requirements for a HV battery system may include and/or affect the vehicle ground connection needed by a BMS. Similar design constraints and/or requirements may likewise include and/or affect the ground connection needed by any other type of electronic assembly or electronic arrangement used in a vehicle. As a result, a need exists for an improved system and method for providing an electrical ground connection for a circuit assembly, such as may be included in a BMS for a HV battery system for an EV or HEV.

SUMMARY

According to one non-limiting exemplary embodiment described herein, a system for providing an electrical ground connection for a circuit assembly is provided. The system may comprise a housing for the circuit assembly, the housing having an electrically conductive fixation member configured for attachment to an electrically conductive element outside the housing. The system may further comprise an electrically conductive feature configured for attachment to the circuit assembly, the electrically conductive feature comprising a flexible contact terminal configured to contact the electrically conductive fixation member inside the housing. Attachment of the electrically conductive fixation member to the electrically conductive element outside the housing enables an electrical ground connection for the circuit assembly via the electrically conductive feature comprising the flexible contact terminal.

According to another non-limiting exemplary embodiment described herein, a system for providing an electrical ground connection for a circuit assembly is provided. The system may comprise an electrically conductive fixation member having a first portion configured to extend inside a housing for the circuit assembly and a second portion configured to extend outside the housing, the second portion further configured for attachment to an electrically conductive element. The system may further comprise an electrically conductive feature configured for attachment to the circuit assembly, the electrically conductive feature comprising a flexible contact terminal configured to contact the first portion of the electrically conductive fixation member configured to extend inside the housing. Attachment of the second portion of the electrically conductive fixation member to the electrically conductive element outside the housing provides an electrical ground connection for the circuit assembly via the electrically conductive feature comprising the flexible contact terminal.

According to yet another non-limiting exemplary embodiment described herein, a method for providing an electrical ground connection for a circuit assembly is provided. The method may comprise installing the circuit assembly inside a housing including an electrically conductive fixation member having a first portion configured to extend inside the housing and a second portion configured to extend outside the housing for attachment to an electrically conductive element. The circuit assembly may have an electrically conductive feature attached thereto, the electrically conductive feature comprising a flexible contact terminal configured to contact the first portion of the electrically conductive fixation member configured to extend inside the housing.

A detailed description of these and other non-limiting exemplary embodiments of a system and method for providing an electrical ground connection for a circuit assembly is set forth below together with the accompanying drawings.

DETAILED DESCRIPTION

Figure 1A:
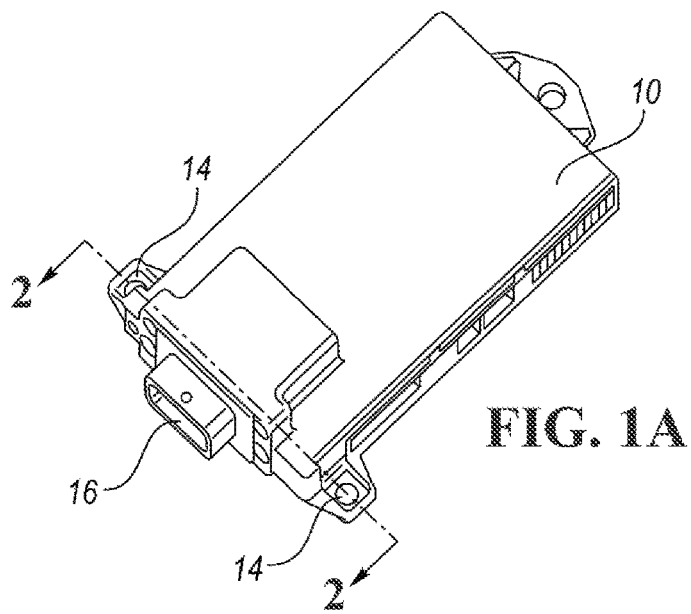
FIGS. 1A-1C are perspective views of a battery monitoring system module for use in a high-voltage battery housing of an electric or hybrid electric vehicle.

As required, detailed non-limiting embodiments are disclosed herein. However, it is to be understood that the disclosed embodiments are merely exemplary and may take various and alternative forms. The figures are not necessarily to scale, and features may be exaggerated or minimized to show details of particular components, elements, features, items, members, parts, portions, or the like. Therefore, specific structural and functional details disclosed herein are not to be interpreted as limiting, but merely as a representative basis for teaching one skilled in the art.

With reference to the Figures, a more detailed description of non-limiting exemplary embodiments of a system and method for providing an electrical around connection for a circuit assembly will be provided. For ease of illustration and to facilitate understanding, like reference numerals may be used herein for like components and features throughout the drawings.

As previously described, compact and/or restrictive placement requirements for a HV battery system in an EV or HEV may include and/or affect the vehicle ground connection needed by a BMS. Similar design constraints and/or requirements may likewise include and/or affect the ground connection needed by any other type of electronic assembly or electronic arrangement used in a vehicle. As a result, a need exists for an improved system and method for providing an electrical ground connection for a circuit assembly, such as may be included in a BMS for a HV battery system for an EV or HEV.

Figure 1B:
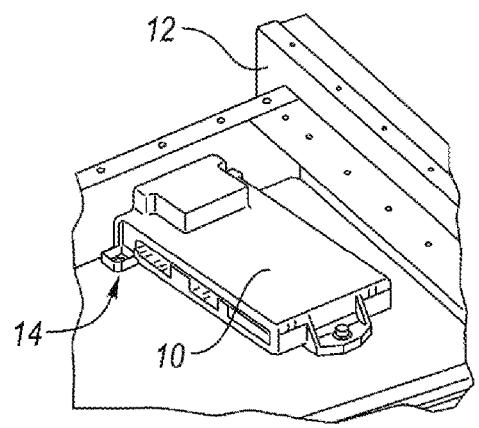
Figure 1C:
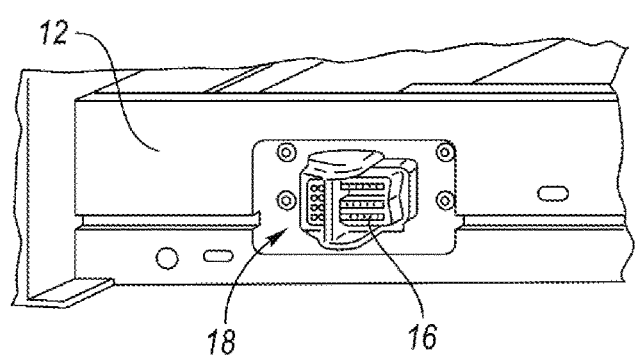

In that regard, FIGS. 1A-1C illustrate perspective views of a module for a battery monitoring system (BMS) for use in a high voltage (HV) battery housing of an electric vehicle (EV) or hybrid electric vehicle (HEV), where the HV battery housing is not size-restricted. As seen therein, according to the configuration and/or design shown, the BMS module 10 may be inserted in a housing 12 for a HV battery. The BMS module 10 may include mounting or fixation features 14, which may include electrically conductive tabs having apertures formed therein. The mounting/fixation features 14 are accessible after insertion of the BMS module 10 into the HV battery housing 12. As a result, using the mounting/fixation features 14, the BMS module 10 may be screwed into the bottom chassis plate of the HV battery housing 12. The BMS module 10 may also be provided with a horizontally oriented electrical connector 16 on one side or a side surface thereof, and the HV battery housing 12 may be provided with a lateral opening 18 through which the electrical connector 16 may extend when the BMS module 10 is mounted to the HV battery housing 12.

Figure 2:
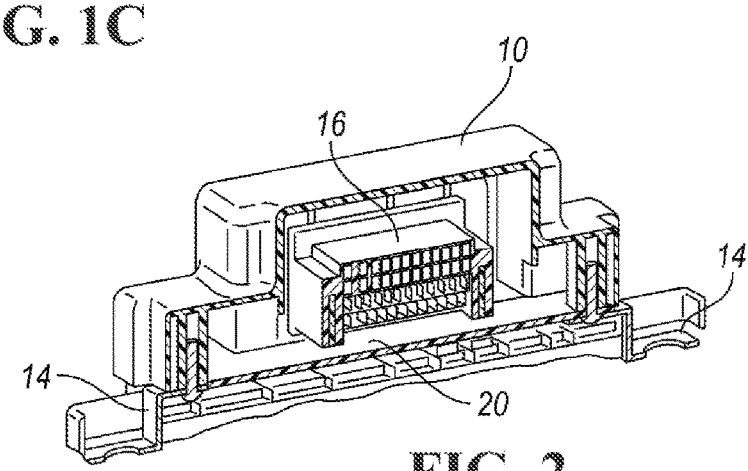
FIG. 2 is a cross-sectional view of the battery monitoring system module of FIG. 1A, taken along the line 2-2.

FIG. 2 illustrates a cross-sectional view of the BMS module 10 of FIG. 1A, taken along the line 2-2. As seen therein, the electrically conductive mounting/fixation features 14 of the BMS module 10 may be connected or attached to a printed circuit board (PCB) of the BMS module 10. As a result, fixation or attachment of the BMS module 10 to the RV battery housing 12 (see FIG. 1B) using screws (not shown) inserted through the apertures formed in the mounting/fixation features 14 also provides a robust electrical ground connection for the BMS module 10, as the HV battery housing 12 (see FIG. 1B) is electrically conductive.

Figure 3:
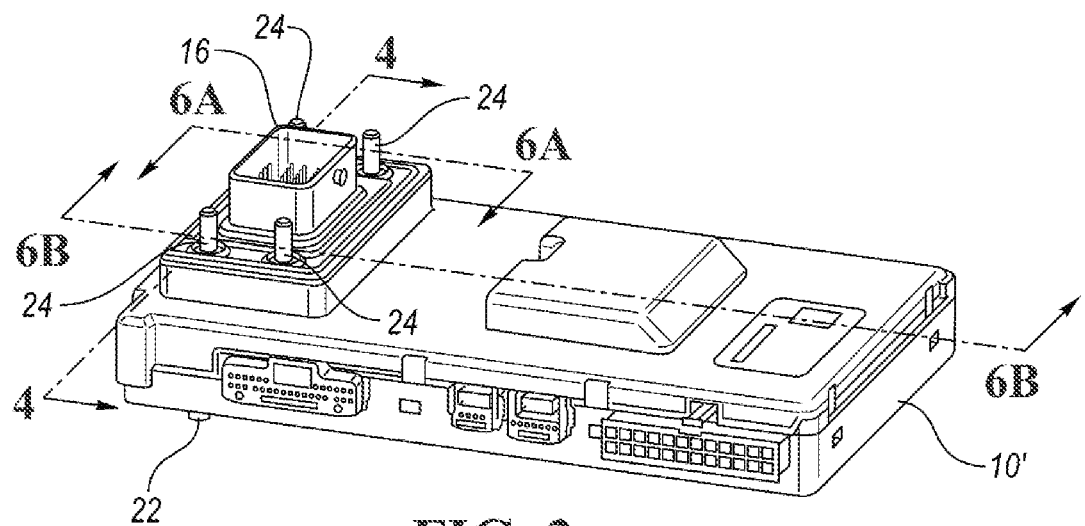
FIG. 3 is a perspective view of an alternative battery monitoring system module including a system and method for providing a ground connection for a circuit assembly according to one non-limiting exemplary embodiment of the present disclosure.

Referring now to FIG. 3, a perspective view is shown of an alternative design for a BMS module 10' including a system and method for providing a ground connection for a circuit assembly according to one non-limiting exemplary embodiment of the present disclosure. As seen therein, the alternative design for the BMS module 10' may include one or more fixation features 22 provided on a bottom surface or side of the BMS module 10'. Such fixation features 22 may be configured for cooperation with features provided on a bottom chassis surface a HV battery housing 12' (see FIGS. 4, 6A, 6B), such as by a snap-in or a snap-on like operation, to thereby mount or attach the BMS module 10' to the HV battery housing 12' (see FIGS. 4, 6A, 6B) in an efficient and effective manner. Such features 22 and fixation are described in greater detail in co-pending U.S. patent application Ser. No. 16/674,593, entitled "System And Method For Mounting An Electronics Arrangement," filed on Nov. 5, 2019, the disclosure of which is hereby incorporated herein by reference in its entirety.

As also seen in FIG. 3, the alternative design of the BMS module 10' may include a vertically oriented electrical connector 16' provided on a top side or top surface thereof. The previously described fixation of the BMS module 10' to the HV battery housing 12' (see FIGS. 4, 6A, 6B) may be blind, and the BMS module 10' may also be provided with one or more fixation members 24 on a top side or top surface thereof. In that regard, fixation members 24, which may comprise threaded bolts or screws, may be configured to attach or fix the BMS module 10' to a top cover of the HV battery housing 12' (see FIGS. 4, 6A, 6B).

Thus, the BMS module 10 shown in FIGS. 1A-1C and 2 has a physical and electrical connection to a bottom plate or surface of the HV battery housing 12. The BMS module 10 may be fixed to the HV battery housing 12 because the fixation points are accessible for screwing after the BMS module 10 has been inserted in place in the HV battery housing 12.

In contrast, the BMS module 10' shown in FIG. 3 has a blind mechanical fixation to an interior surface of the HV battery housing 12' via the non-conductive (e.g., plastic) fixation features 22 of the housing of the BMS module 10'. Because the housing of the BMS module 10', including the fixation features 22, are non-conductive (e.g., plastic), only the external fixation members 24 (e.g., threaded bolts or screws) configured for attaching the BMS module 10' to a top surface or cover of the HV battery housing 12' are available for establishing a ground connection for the BMS module 10'. In that regard, one or more of the fixation members 24 may be electrically conductive and, as a result, may also be used to connect the BMS module 10' to an electrically conductive element outside the housing of the BMS module 10' and thereby establish, enable, create, provide, or complete an electrical ground connection or path, either directly or indirectly through the HV battery housing 12', as will be further described herein.

Figure 5A:
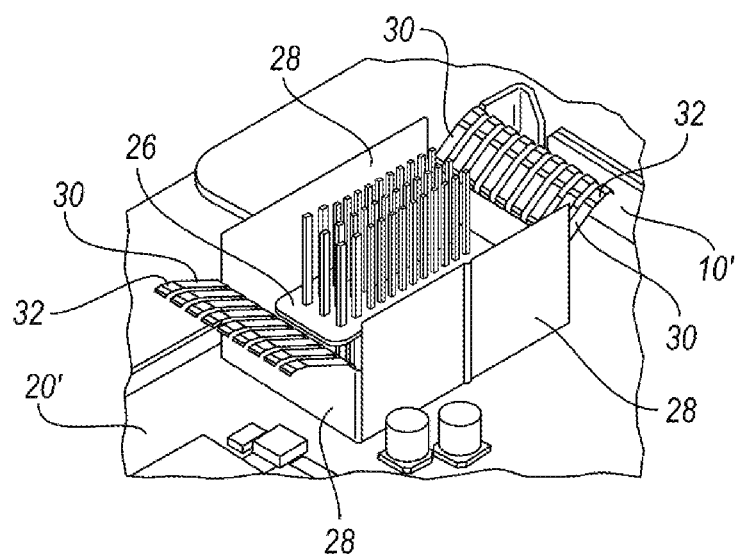
FIGS. 5A and 5B are perspective views of the alternative battery monitory system module of FIG. 3 including a system and method for providing a ground connection for a circuit assembly according to one non-limiting exemplary embodiment of the present disclosure.
Figure 5B:
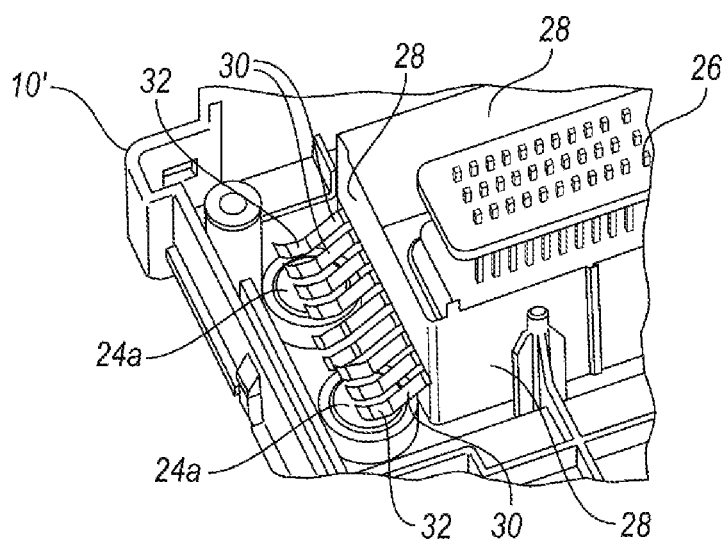
Figure 4:
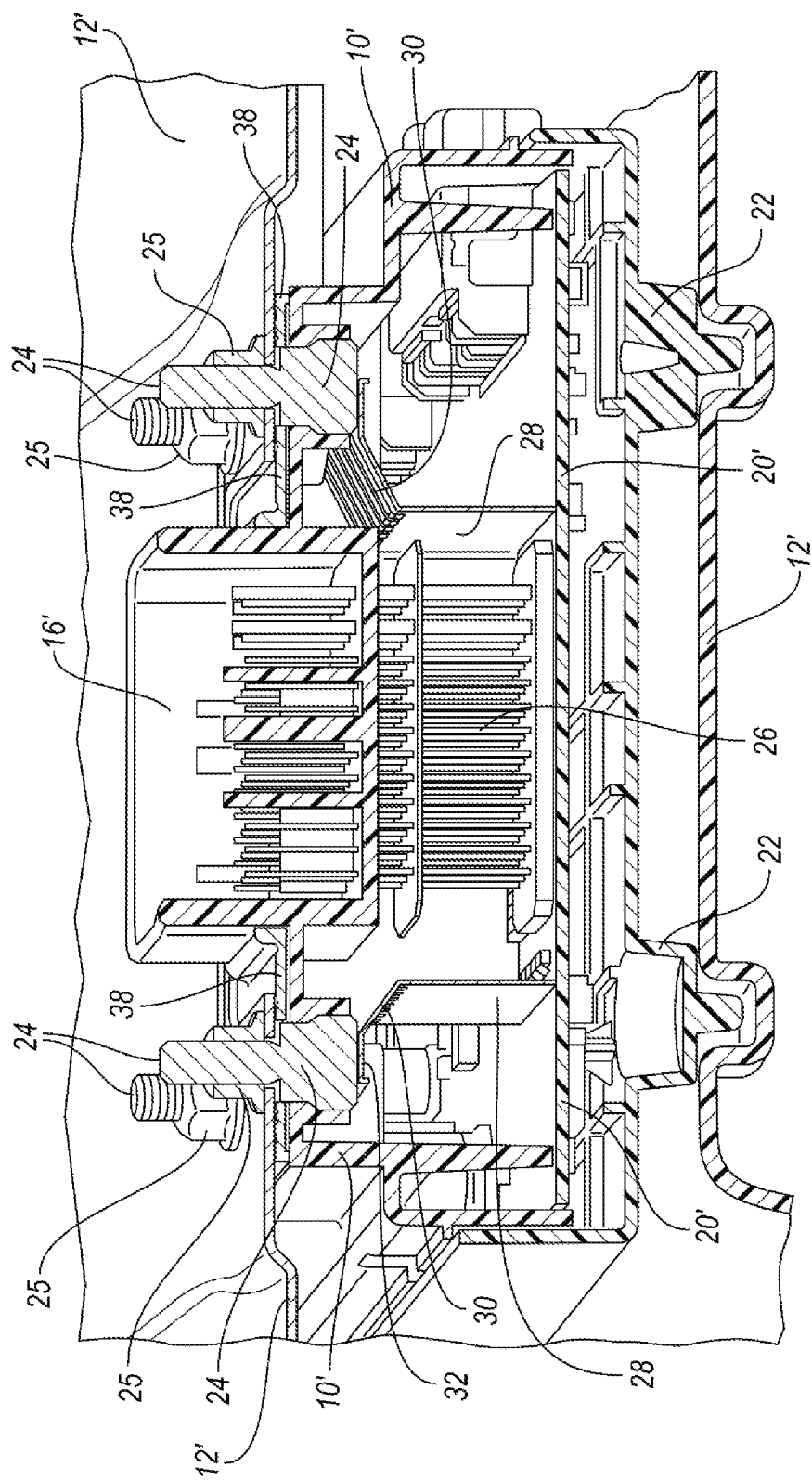
FIG. 4 is a lateral cross-sectional view of the alternative battery monitory system module of FIG. 3 taken along line 4-4 thereof, including a system and method for providing a ground connection for a circuit assembly according to one non-limiting exemplary embodiment of the present disclosure.
Figure 6A:
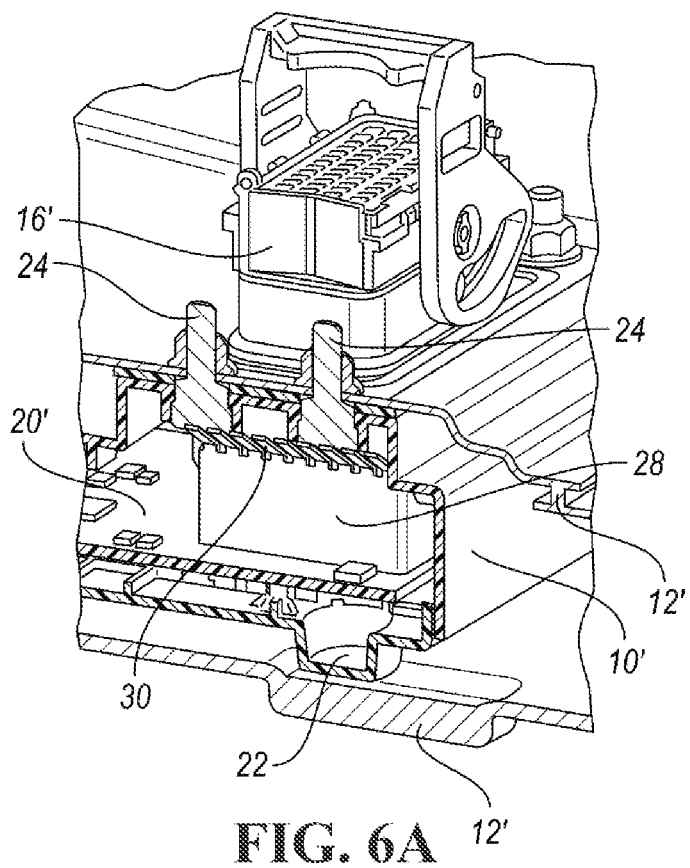
FIGS. 6A and 6B are longitudinal cross-sectional views of the alternative battery monitory system module of FIG. 3 taken along lines 6A-6A and 6B-6B thereof, respectively, including a system and method for providing a ground connection for a circuit assembly according to one non-limiting exemplary embodiment of the present disclosure.
Figure 6B:
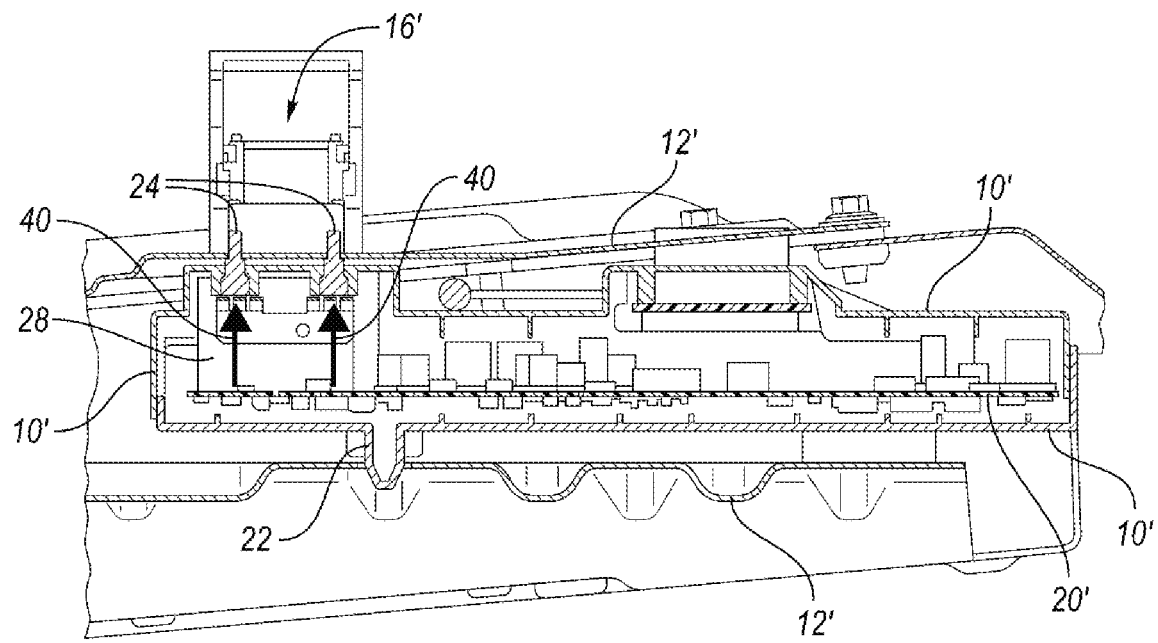

FIG. 4 is a lateral cross-sectional view of the alternative BMS module 10' of FIG. 3 taken along line 4-4 thereof, illustrating a system and method for providing a ground connection for a circuit assembly according to one non-limiting exemplary embodiment of the present disclosure. FIGS. 5A and 5B are perspective views of the alternative BMS module 10' of FIG. 3, further illustrating a system and method for providing a ground connection for a circuit assembly according to one non-limiting exemplary embodiment of the present disclosure. FIGS. 6A and 6B are longitudinal cross-sectional views of the alternative BMS module 10' of FIG. 3 taken along lines 6A-6A and 6B-6B thereof, respectively, still further illustrating the system and method for providing a ground connection for a circuit assembly according to one non-limiting exemplary embodiment of the present disclosure.

As seen in FIGS. 4, 5A, 5B, 6A, and 6B, the electrical connector 16' of the BMS module 10' may include or comprise a pin header 26 having a plurality of pins. The pin header 26 may be configured for attachment to a printed circuit board (PCB) 20' of the BMS module 10', which PCB 20' may include or have mounted thereon or therein any type or number of electrical or electronic components for use in monitoring a HV battery for an EV or HEY. In that regard, the electrical connector 16', the pin header 26, the PCB 20', and any of the electrical or electronic components previously described may comprise, be referred to as, constitute, or include an electric, electrical, or electronic circuit or circuit assembly.

The BMS module 10 may also include or comprise an electrically conductive feature 28 that fully or partially surrounds the pin header 26 of the vertically oriented electrical connector 16' in order to provide electromagnetic compatibility (EMC) or electromagnetic interference (EMI) shielding to the electrical connector 16'. The electrically conductive feature or shield 28 may include a wall portion or portions that may be configured to be electrically and mechanically fixed or attached to PCB by tin soldering or by a press-fit feature, normally being a through-hole technology (THT) component as regards the electronic circuit. Alternatively, a surface mount design (SMD) may also be used. In that regard, the shield 28 may be fixed or attached in such a fashion to an electrical around of the PCB 20', which may take the form of or comprise an island, trace, point, layer, or component of the PCB 20'.

According to the system and method of the present disclosure, the shield 28 of the electrical connector 16' may be used to establish, enable, create, provide, or complete a ground connection from a vehicle chassis (not shown) to the PCB 20' through the electrically conductive fixation members 24. In that regard, one or more electrically conductive flexible contact terminals 30 may be added to or formed from/in the shield 28. As seen in FIG. 4, such flexible contact terminals 30 may be configured to establish, provide, create, complete, or enable an electrical contact path between an electrical ground of the PCB 20' and the electrically conductive fixation members 24.

In that regard, the electrically conductive shield 28 may be stamped to create the one or more flexible terminals 30. Moreover, the fixation members 24 may be overmolded in the non-conductive (e.g., plastic) housing of the BMS module 10'. A portion of the fixation member(s) may extend outside the housing of the BMS module 10', thereby providing for or enabling both electrical and mechanical fixation of the BMS module 10' to an electrically conductive element or electrical ground terminal or electrical ground path outside the housing of the BMS module 10', such as the electrically conductive cover of the HV battery housing 12'. Such overmolding of the fixation members 24 in the plastic housing of the BMS module 10' may leave a portion of the fixation members 24 accessible for contact with the flexible terminal contacts 30 of the shield 28. As shown, one or more of the fixation members 24 may have a first portion that may be configured to extend and/or be exposed inside the housing of the BMS module 10' and may be provided with a flat head 24a to provide for robust electrical contact and conductivity with the flexible contact terminals 30 of the shield 28. The terminal contacts 30 comprise a material, such as for example copper, having sufficient flexibility to enable adaptation to structural tolerances in the BMS module 10'. Moreover, contact of multiple flexible terminal contacts 30 to multiple fixation members 24 may improve the electrical connection path by lowering electrical resistance and improving ageing endurance. In that regard, it should be noted that while four fixation members 24 and eighteen flexible terminal contacts 30 are shown, any number of either may alternatively be provided or utilized.

The top portion or cover of the HV battery housing 12' may have an aperture formed therein configured to receive the vertically oriented electrical connector 16' of the BMS module 10'. The cover of the HV battery housing 12' may also have apertures formed therein configured to receive a second portion of the fixation members 24 of the BMS module 10', which second portion may be configured to extend outside the housing of the BMS module 10. An electrically conductive fixation members 24 may also be provided with a surface or shoulder configured to contact the electrically conductive HV battery housing 12' and thereby ensure robust electrical contact and conductivity between the fixation member 24 and the HV battery housing 12'. One or more threaded nuts 25 may be provided and/or configured for mechanical (e.g., screwed) and/or electrical fixation or attachment of the HV battery housing 12' to the fixation members 24. The electrical ground connection path established, illustrated at least in part by arrows 40 (see FIG. 6B), may be described as follows: GND of PCB 20'→shield 28→flexible contact terminal(s) 30→fixation member(s) 24→cover of HV-Battery housing 12'→vehicle chassis (GND) (not shown). A water-tight sealing member 38, such as a rubber or silicon gasket, may also be provided. Sealing may be provided between a cover of the HV battery housing 12' and a top cover of the housing of the BMS module 10. The purpose of such sealing is to avoid water (liquid) ingress into the HV battery system. The seal 38 may be provided with a "lip" to close the cover of the HV battery housing 12' with the exterior surface of the cover of the BMS module 10. The seal 38 may also be provided with another "lip" surrounding each of the fixation members 24 to ensure no ingress of water (liquid) into the BMS module 10 through a protruding fixation member 24 (i.e., between bolts 24 and the surrounding plastic). The screw-bolt fixation also compresses the rubber gasket 38 to ensure that it seals properly. To ensure connection mechanical torque and electrical contact, no gasket is provided between the bolt, cover, nut fixation. In that regard, as the nut 25 is metallic, it is also in electrical contact.

The system and method of the present disclosure thus provide direct connection of an electronic circuit to a vehicle chassis (GND) without adding any components, thereby minimizing cost. As previously noted, the flexible terminal contacts 30 allow for tolerance absorption, thereby enabling ground connection simplicity. Moreover, no additional assembly is required to ensure an electrical ground connection, thereby simplifying installation and/or manufacturing.

Thus, according to the system and method of the present disclosure, the shield 28 for the electrical connector 16' may be attached to the PCB 20', such as by soldering, press-fit fixation, or the like. The electronic circuit or circuit assembly (which may comprise PCB 20') may be attached to the plastic bottom of and/or installed in the housing of the BMS module 10', such as by screws. The plastic top cover of the housing of the BMS module 10', already having had the fixation members 24 formed therein, such as by overmolding, may be placed over the plastic bottom of the housing of the BMS module 10' including the circuit assembly in a closure operation. In so doing, a portion of the flexible contact terminals 30 (e.g., flat surface 32) of the shield 28, which may be configured to contact the fixation member 24, may be pressed down by the bottom (e.g., flat head 24a) of the fixation members 24 to thereby establish, create, provide, complete, or enable an internal ground path inside the BMS module 10'. The assembled BMS module 10' may be inserted into and fixed to the bottom portion or base of the HV battery housing 12', such as by fixation features 22. The top portion or cover of the HV battery housing 12' may be attached to the BMS module 10' in a closure operation using the fixation members 24 formed in and extending outside the housing of the BMS module 10'. The fixation members 24 may be received by cooperating apertures formed in the cover of the HV battery housing 12', which may be secured to the BMS module 10' using nut(s) 25. A ground connection to the circuit assembly may be completed, created, established, enabled, or provided by integration of the HV battery housing 12' into a vehicle, such as an EV or HEV.

The present disclosure thus describes an improved system and method for providing an electrical ground connection for a circuit assembly, such as may be included in a BMS for a HV battery system for an EV or HEV. In that regard, the HV battery system environment or application described in connection with the system and method for providing an electrical ground connection for a circuit assembly of the present disclosure is exemplary only and the system and method of the present disclosure may be used in other environments or applications. The system and method for providing an electrical ground connection for a circuit assembly described herein overcome, address, solve, or mitigate compact and/or restrictive placement requirements for a HV battery system in an EV or REV that may include and/or affect the vehicle ground connection needed by a BMS. The system and method for providing an electrical ground connection for a circuit assembly described herein also overcome, address, solve, or mitigate similar design constraints and/or requirements that may likewise include and/or affect the ground connection needed by any other type of electronic assembly or electronic arrangement used in a vehicle.

As is readily apparent from the foregoing, various non-limiting embodiments of a system and method for providing an electrical ground connection for a circuit assembly have been described. While various embodiments have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the following claims.

What is claimed is:

1. A system for providing an electrical ground connection for a circuit assembly, the system comprising:
    a housing for the circuit assembly, the housing having an electrically conductive fixation member configured for attachment to an electrically conductive element outside the housing; and
    an electrically conductive feature configured for attachment to the circuit assembly, the electrically conductive feature comprising a flexible contact terminal configured to contact the electrically conductive fixation member inside the housing;
    wherein attachment of the electrically conductive fixation member to the electrically conductive element outside the housing enables an electrical ground connection for the circuit assembly via the electrically conductive feature comprising the flexible contact terminal;
    wherein the electrically conductive fixation member comprises a first portion configured to extend inside the housing, the first portion having a flat head, and wherein the flexible contact terminal of the electrically conductive feature comprises a flat surface configured to contact the flat head of the electrically conductive fixation member.

2. The system of claim 1 wherein the electrically conductive feature is further configured to act as an electromagnetic interference shield.

3. The system of claim 2 wherein the electrically conductive feature further comprises a wall portion configured for attachment to the circuit assembly, and wherein the flexible contact terminal extends from the wall portion.

4. The system of claim 3 wherein the circuit assembly comprises a printed circuit board (PCB) and the wall portion is configured for attachment to the PCB by solder or a press-fit feature.

5. The system of claimer 1 wherein the electrically conductive fixation member comprises a second portion configured to extend outside the housing, the second portion having a threaded shaft adapted to receive a nut for attachment of the electrically conductive fixation member to the electrically conductive element.

6. The system of claim 5 wherein the electrically conductive fixation member is overmolded in the housing.

7. The system of claim 1 wherein the circuit assembly and the housing comprise a module for a battery monitoring system, the electrically conductive feature further comprises an electromagnetic interference shield for an electrical connector configured for attachment to the circuit assembly, and the electrically conductive element comprises a cover for a high-voltage battery.

8. A system for providing an electrical ground connection for a circuit assembly, the system comprising:
    an electrically conductive fixation member having a first portion configured to extend inside a housing for the circuit assembly and a second portion configured to extend outside the housing, the second portion further configured for attachment to an electrically conductive element; and
    an electrically conductive feature configured for attachment to the circuit assembly, the electrically conductive feature comprising a flexible contact terminal configured to contact the first portion of the electrically conductive fixation member configured to extend inside the housing;
    wherein attachment of the second portion of the electrically conductive fixation member to the electrically conductive element outside the housing enables an electrical ground connection for the circuit assembly via the electrically conductive feature comprising the flexible contact terminal.

9. The system of claim 8 wherein the electrically conductive feature is further configured to act as an electromagnetic interference shield.

10. The system of claim 9 wherein the electrically conductive feature further comprises a wall portion configured for attachment to the circuit assembly, and wherein the flexible contact terminal extends from the wall portion.

11. The system of claim 10 wherein the circuit assembly comprises a printed circuit board (PCB) and the wall portion is configured for attachment to the PCB by solder or a press-fit feature.

12. The system of claim 8 wherein the first portion of the electrically conductive fixation member configured to extend inside the housing comprises a flat head and the flexible contact terminal of the electrically conductive feature comprises a flat surface configured to contact the flat head of the electrically conductive fixation member.

13. The system of claim 12 wherein the second portion of the electrically conductive fixation member configured to extend outside the housing comprises a threaded shaft adapted to receive a nut for attachment of the electrically conductive fixation member to the electrically conductive element.

14. The system of claim 13 wherein the electrically conductive fixation member is overmolded in the housing.

15. The system of claim 8 wherein the circuit assembly and the housing comprise a module for a battery monitoring system, the electrically conductive feature further comprises an electromagnetic interference shield for an electrical connector configured for attachment to the circuit assembly, and the electrically conductive element comprises a cover for a high-voltage battery.

16. A method for providing an electrical ground connection for a circuit assembly, the method comprising:
   installing the circuit assembly inside a housing including an electrically conductive fixation member having a first portion configured to extend inside the housing and a second portion configured to extend outside the housing for attachment to an electrically conductive element;
   wherein the circuit assembly has an electrically conductive feature attached thereto, the electrically conductive feature comprising a flexible contact terminal configured to contact the first portion of the electrically conductive fixation member configured to extend inside the housing.

17. The method of claim 16 further comprising attaching the second portion of the electrically conductive fixation member to the electrically conductive element outside the housing to provide an electrical ground connection for the circuit assembly via the electrically conductive feature comprising the flexible contact terminal.

18. The method of claim 16 wherein the circuit assembly comprises a printed circuit board (PCB), the method further comprising attaching the electrically conductive feature to the PCB by soldering or press-fitting.

19. The method of claim 16 further comprising overmolding the electrically conductive fixation member in the housing.

20. A system for providing an electrical ground connection for a circuit assembly, the system comprising:
   a housing for the circuit assembly, the housing having an electrically conductive fixation member configured for attachment to an electrically conductive element outside the housing; and
   an electrically conductive feature configured for attachment to the circuit assembly, the electrically conductive feature comprising a flexible contact terminal configured to contact the electrically conductive fixation member inside the housing;
   wherein attachment of the electrically conductive fixation member to the electrically conductive element outside the housing enables an electrical ground connection for the circuit assembly via the electrically conductive feature comprising the flexible contact terminal;
   wherein the circuit assembly and the housing comprise a module for a battery monitoring system, the electrically conductive feature further comprises an electromagnetic interference shield for an electrical connector configured for attachment to the circuit assembly, and the electrically conductive element comprises a cover for a high-voltage battery.

21. A system for providing an electrical ground connection for a circuit assembly, the system comprising:
   a housing for the circuit assembly, the housing having an electrically conductive fixation member comprising a first portion configured to extend inside the housing for the circuit assembly and a second portion configured to extend outside the housing for attachment to an electrically conductive element outside the housing; and
   an electrically conductive feature configured for attachment to the circuit assembly, the electrically conductive feature comprising a flexible contact terminal configured to contact the first portion of the electrically conductive fixation member inside the housing;
   wherein attachment of the second portion of the electrically conductive fixation member to the electrically conductive element outside the housing enables an electrical ground connection for the circuit assembly via the electrically conductive feature comprising the flexible contact terminal.

* * * * *